(12) United States Patent
Lim et al.

(10) Patent No.: US 10,547,955 B2
(45) Date of Patent: Jan. 28, 2020

(54) MICROPHONE PACKAGE FOR FULLY ENCAPSULATED ASIC AND WIRES

(71) Applicant: Knowles Electronics, LLC, Itasca, IL (US)

(72) Inventors: Tony K. Lim, Naperville, IL (US); John Szczech, Itasca, IL (US); Joshua Watson, Itasca, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/988,983

(22) Filed: May 24, 2018

(65) Prior Publication Data

US 2018/0343524 A1 Nov. 29, 2018

Related U.S. Application Data

(60) Provisional application No. 62/511,221, filed on May 25, 2017.

(51) Int. Cl.
*H04R 19/04* (2006.01)
*H04R 1/04* (2006.01)
*H04R 19/00* (2006.01)

(52) U.S. Cl.
CPC ............ *H04R 19/04* (2013.01); *H04R 1/04* (2013.01); *H04R 19/005* (2013.01); *H04R 2201/003* (2013.01)

(58) Field of Classification Search
USPC .... 381/26, 92, 361, 113, 114, 116, 111, 122
See application file for complete search history.

(56) References Cited

U.S. PATENT DOCUMENTS

| 7,190,038 | B2 | 3/2007 | Dehe et al. |
| 7,473,572 | B2 | 1/2009 | Dehe et al. |
| 7,781,249 | B2 | 8/2010 | Laming et al. |
| 7,795,695 | B2 | 9/2010 | Weigold et al. |
| 7,825,484 | B2 | 11/2010 | Martin et al. |
| 7,829,961 | B2 | 11/2010 | Hsiao |

(Continued)

FOREIGN PATENT DOCUMENTS

EP 2 963 946 A2 1/2016

OTHER PUBLICATIONS

International Search Report and Written Opinion for PCT/US2018/050533 dated Nov. 30, 2018.

(Continued)

*Primary Examiner* — Yosef K Laekemariam
(74) *Attorney, Agent, or Firm* — Foley & Lardner LLP (57) ABSTRACT

A microphone device includes a housing including a substrate having a first surface and a cover disposed over the substrate, the housing including a sound port between the interior of the housing and the exterior of the housing. The device also includes a microelectromechanical systems (MEMS) transducer mounted on the substrate and an integrated circuit (IC) mounted on the substrate. The MEMS transducer of the device is electrically connected to the IC, and the IC of the device is electrically connected to a conductor on the substrate. An encapsulating material covers the IC. And an encapsulating material confinement structure is disposed between the MEMS transducer and the IC, wherein the encapsulating material confinement structure at least partially confines the encapsulating material around the IC.

31 Claims, 8 Drawing Sheets

(56) References Cited

U.S. PATENT DOCUMENTS

| | | |
|---|---|---|
| 7,856,804 B2 | 12/2010 | Laming et al. |
| 7,903,831 B2 | 3/2011 | Song |
| 8,018,049 B2 | 9/2011 | Minervini |
| 9,640,531 B1 | 5/2017 | Or-Bach et al. |
| 2005/0018864 A1 | 1/2005 | Minervini |
| 2005/0207605 A1 | 9/2005 | Dehe et al. |
| 2007/0222008 A1* | 9/2007 | Chen .................. B81C 1/00896 257/415 |
| 2007/0278501 A1 | 12/2007 | MacPherson et al. |
| 2008/0056524 A1 | 3/2008 | Sakakibara et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1* | 2/2010 | Song .................. H04R 19/016 381/361 |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2013/0105952 A1 | 5/2013 | Fontana et al. |
| 2014/0029078 A1* | 1/2014 | Fennell ................. B81B 7/0058 359/238 |
| 2014/0246739 A1 | 9/2014 | Protheroe et al. |
| 2014/0367810 A1 | 12/2014 | Vos et al. |
| 2016/0100256 A1 | 4/2016 | Watson et al. |

OTHER PUBLICATIONS

International Search Report and Written Opinion, PCT/US2018/034475, Knowles Electronics, LLC 13 pages (dated Oct. 25, 2018).

\* cited by examiner

MICROPHONE PACKAGE FOR FULLY ENCAPSULATED ASIC AND WIRES

CROSS-REFERENCE TO RELATED APPLICATIONS

This application claims the benefit of and priority to U.S. Provisional Application No. 62/511,221, filed May 25, 2017, the entire contents of which are incorporated herein by reference.

BACKGROUND

In a micro electro mechanical system (MEMS) microphone, a MEMS die includes at least one diaphragm and at least one back plate. The MEMS die is supported by a base or substrate and enclosed by a housing (e.g., a cup or cover with walls). A port may extend through the substrate (for a bottom port device) or through the top of the housing (for a top port device). Sound energy traverses through the port, moves the diaphragm, and creates a changing electrical potential of the back plate, which creates an electrical signal. Microphones are deployed in various types of devices such as personal computers or cellular phones.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

The present disclosure describes devices and techniques for improving robustness of microphone devices, such as those incorporating microelectromechanical systems (MEMS) transducers. In some embodiments, the devices and techniques described in the present disclosure reduce the risk of damage to the MEMS transducer via use of an encapsulating material used to cover other components of the microphone device. In some embodiments, the radio frequency response of the MEMS transducer is improved, such as by reducing noise across one or more frequency ranges.

In one or more embodiments, an encapsulating material is deposited over an application specific integrated circuit and a set of wires such that the encapsulating material completely covers the application specific integrated circuit and/or the set of wires.

In one or more embodiments, the MEMS transducer is mounted on a raised platform of a substrate that can further isolate the MEMS transducer from the encapsulating material.

In one or more embodiments, the microphone device can include a heat shield within the encapsulating material that at least partially covers the ASIC and that reflects heat radiation generated by the ASIC.

Figure 1:
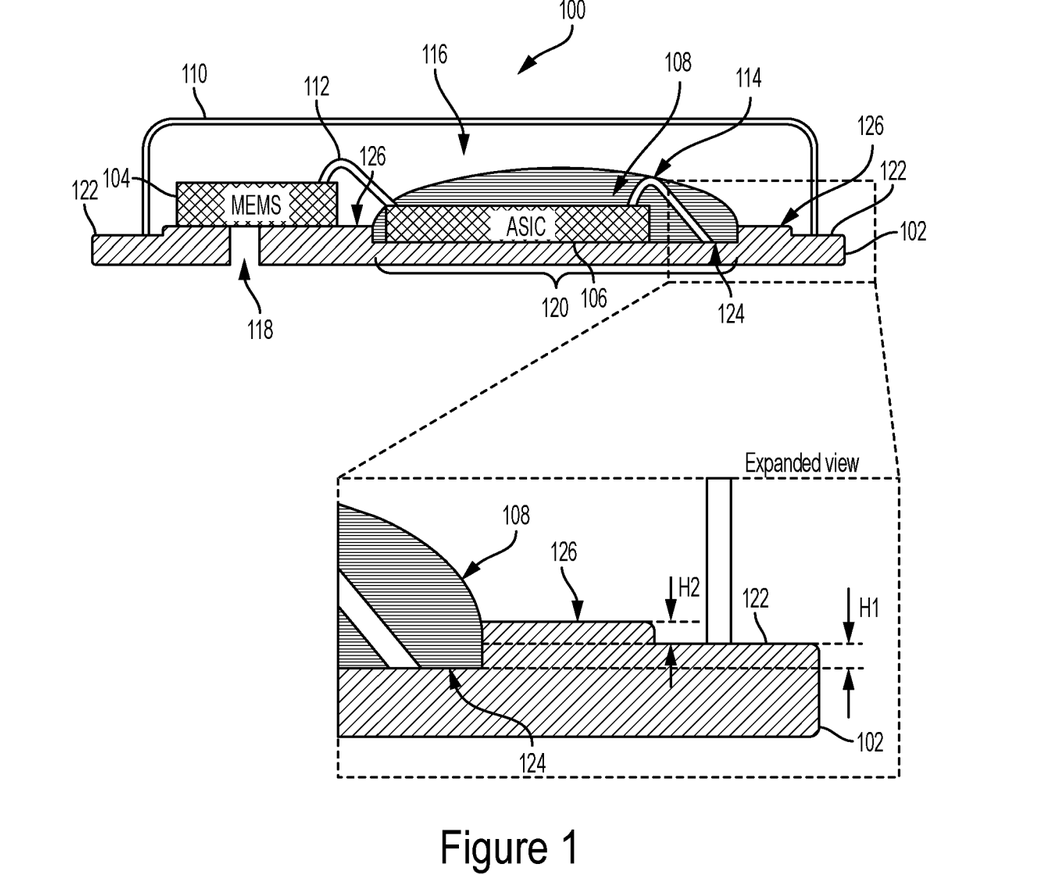
FIG. 1 is a representation of a cross-sectional view of first example microphone device according to embodiments of the present disclosure.

FIG. 1 is a representation of a cross-sectional view of first example microphone device 100 according to embodiments of the present disclosure. The first example microphone device 100 includes a substrate 102, a microelectromechanical systems (MEMS) transducer 104, an application specific integrated circuit (ASIC) 106, an encapsulating material 108, and a cover 110. The MEMS transducer 104 and the ASIC 106 are disposed on one side of the substrate 102. A first set of wires 112 electrically connect the MEMS transducer 104 to the ASIC 106, while a second set of wires 114 electrically connect the ASIC 106 to conductive traces (not shown) on the substrate 102. The MEMS transducer 104, the ASIC 106, and the substrate 102 can include conductive bonding pads to which ends of the first set of wires 112 and the second set of wires 114 can be bonded. In some embodiments, the first set of wires 112 and the second set of wires 114 can be bonded to the appropriate bonding pads using a solder. The cover 110 can be affixed on the substrate 102 to enclose and protect the MEMS transducer 104, the ASIC 106 and any bonding wires. The cover 110 can include materials such as plastic or metal. The cover 110, the substrate 102, the MEMS transducer 104 and the ASIC 106 define an enclosed back-volume 116, a magnitude of which can be factored into selecting performance parameters of the MEMS transducer 104. In some embodiments, the cover 110 is affixed to the substrate 102, and in some embodiments the enclosed volume is hermetically sealed. The substrate 102 can include a cover bonding surface (discussed below in relation to FIG. 2) for bonding the cover 110 onto the substrate 102.

The MEMS transducer 104 can include a conductive diaphragm positioned in a distance relationship with a conductive back plate. The diaphragm is configured to move in relation to the back plate in response to incident acoustic signals. The movement of the diaphragm in relation to the back plate causes a capacitance associated with the MEMS transducer 104 to vary. The change in the capacitance of the MEMS transducer 104 in response to the acoustic signals can be measured and converted into a corresponding electrical signal.

The ASIC 106 can include a package that encloses analog and/or digital circuitry for processing electrical signals received from the MEMS transducer 104. In one or more embodiments, the ASIC 106 can be an integrated circuit package having a plurality of pins or bonding pads that facilitate electrical connectivity to components outside of the ASIC 106 via wires. In particular, the ASIC 106 can include bonding pads to which the first set of wires 112 and the second set of wires 114 can be connected. The analog or digital circuitry can include amplifiers, filters, analog-to-digital converters, digital signal processor, and other electrical circuitry for processing the electrical signals received from the MEMS transducer 104 and other components on the substrate 102.

The substrate 102 can include, without limitation, a printed circuit board, a semiconductor substrate, or a combination thereof. A portion of the substrate 102 adjacent to the MEMS transducer 104 defines a through-hole that forms a port 118 of the first example microphone device 100. Acoustic signals enter the first example microphone device 100 through the port 118, and cause the displacement of the diaphragm on the MEMS transducer 104. The MEMS transducer 104, based on its response characteristics, can generate electrical signals corresponding to the incident audio signals.

The substrate 102 can define an ASIC cavity 120 in the front surface 122 of the substrate 102. The substrate 102 may extend from a front surface 122 of the substrate 102 to an ASIC mounting surface 124 of the substrate 102. In the illustrated embodiment, the front surface 122 and the ASIC mounting surface 124 are on separate planes. In some embodiments, the front surface 122 and the ASIC mounting surface 124 may be in the same plane: for example, in some embodiments, the MEMS transducer 104 may be mounted on a raised platform, such as in the manner described in further detail below, and the front surface 122 and the ASIC mounting surface 124 may be in the same plane. The ASIC 106 is positioned on the ASIC mounting surface 124 of the ASIC cavity 120. In some embodiments, the ASIC 106 is mounted on the ASIC mounting surface 124 using a binding material such as solder or glue. While not shown in FIG. 1, the ASIC mounting surface can include one or more conductive bonding pads to provide a connection between conductive traces on the substrate and the ASIC 106. The second set of wires 114 connect the bonding pads on the ASIC mounting surface 124 to the bonding pads on the ASIC 106. In some embodiments, a height H1 of the ASIC cavity 120 (i.e., a height from the ASIC mounting surface 124 to the front surface 122) can be less than the height of the ASIC 106, such that a portion of the ASIC extends above the cavity.

The substrate 102 also includes a platform 126 that is raised up above the front surface 122. In the illustrated embodiment, the height H1 of the ASIC cavity 120 is greater than a height H2 by which the platform 126 is raised above the front surface 122. In some embodiments, the height H2 may be greater than or equal to the height H1. The platform 126 can be formed around the perimeter of the ASIC cavity 120. In some embodiments, the platform 126 can form a sidewall of the ASIC cavity 120. In some other embodiments, the platform 126 can be separated from the ASIC cavity 120 by the front surface 122. The MEMS transducer 104 is mounted on a top surface of the platform 126. The port 118, discussed above, extends through the substrate 102 at a position where the MEMS transducer 104 is mounted.

The encapsulating material 108 completely covers the ASIC 106 and/or the second set of wires 114, and, in some embodiments, completely covers both the ASIC 106 and the second set of wires 114. The encapsulating material 108 can be a non-conductive material such as epoxy. One process stage during the manufacturing of the first example microphone device 100 can include the deposition of the encapsulating material 108 over the ASIC 106. The encapsulating material 108 can be deposited such that it completely covers the ASIC 106 and the second set of wires 114 that extend from the ASIC 106 to the substrate 102. During deposition, the encapsulating material 108 can be in a high temperature and low viscosity state. Over time, the encapsulating material 108 cools and solidifies to form a covering over the ASIC 106 and the second set of wires 114. But during deposition, the low viscosity of the encapsulating material 108 can result in lateral spreading of the encapsulating material. In instances where the ASIC 106 and the MEMS transducer 104 are disposed on the same surface of the substrate 102, the lateral spreading of the encapsulating material 108 may result in the encapsulating material 108 making contact with the MEMS transducer 104. This may damage the MEMS transducer 104. By placing the ASIC 106 and the second set of wires 114 within the ASIC cavity 120, the lateral spreading of the encapsulating material 108, during and after deposition, is confined to within the sidewalls of the ASIC cavity 120. Thus, the MEMS transducer 104, and other components mounted on the substrate 102, can be protected from undesirable contact with the encapsulating material 108.

After the encapsulating material 108 solidifies, its upper surface can form a curvature that encloses the ASIC 106 and the second set of wires 114. In some embodiments, a height of the encapsulating material 108 can be represented by a greatest distance between a point on a top surface of the encapsulating material 108 and the ASIC mounting surface 124. In some embodiments, the height of the encapsulating material 108 can be equal to or greater than a greatest distance that the second set of wires 114 or the ASIC 106 extend from the ASIC mounting surface 124.

The platform 126 provides additional protection from the encapsulating material 108. That is, mounting the MEMS transducer 104 on the platform 126 further isolates the MEMS transducer 104 from the encapsulating material 108. In some embodiments, a height of the platform 126 can be based on the volume of encapsulating material 108 that needs to be deposited to completely cover the ASIC 106 and the second set of wires 114, and the available volume within the ASIC cavity 120.

Figure 2:
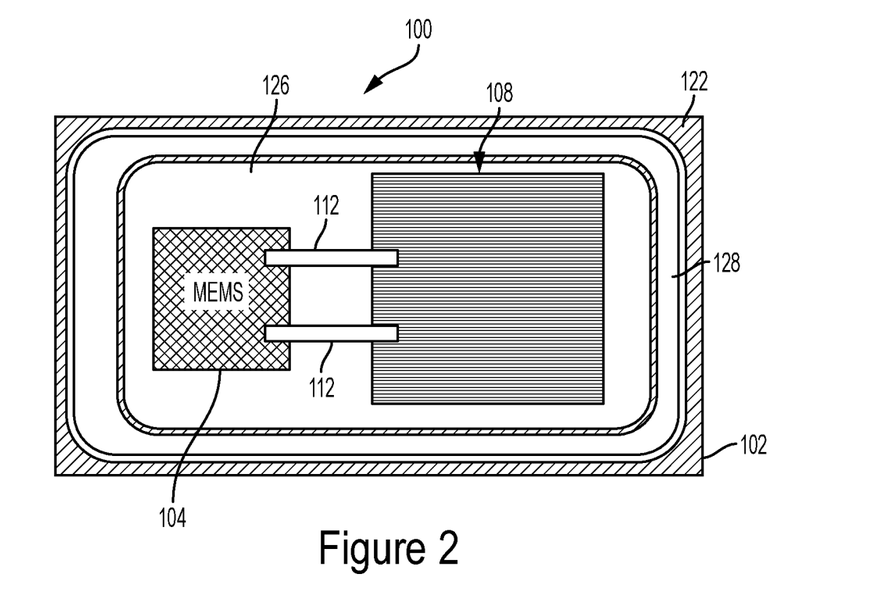
FIG. 2 depicts a representation of a top view of the first example microphone device shown in FIG. 1.

FIG. 2 depicts a representation of a top view of the first example microphone device 100 shown in FIG. 1. In particular, the top view is shown without the cover 110. The encapsulating material 108 completely covers the ASIC 106 and the second set of wires 114, which extend from the ASIC 106 to the substrate 102. The platform 126 surrounds the encapsulating material 108, which, in the illustrated embodiment of FIG. 2, is completely covering the ASIC cavity 120 shown in FIG. 1. The first set of wires 112, which extend between the MEMS transducer 104 and the ASIC 106 are partially covered by the encapsulating material 108. The front surface 122 of the substrate 102 also includes a cover bonding surface 128, which facilitates bonding the cover 110 with the substrate 102. In the illustrated embodiment, the cover bonding surface 128 is separated from the platform 126 by a portion of the front surface 122 (i.e., such that, from an inner portion of the microphone device 100, the surfaces transition from the platform 126 to an inner portion of the front surface 122, then to the cover bonding surface 128, and finally to an outer portion of the front surface 122). In some embodiments, the cover bonding surface 128 may extend to the edge of the platform 126 with no intervening portion of the front surface 122. In some embodiments, the cover bonding surface 128 can be a metal surface that can bond with a metal periphery of the cover 110 using a solder or a glue. The platform 126 not only protects the MEMS transducer 104 from the encapsulating material 108, but also protects the cover bonding surface 128 from contact with the encapsulating material 108. This prevents any defect in bonding of the cover 110 to the substrate, which may occur if the encapsulating material 108 were to spill over to the cover bonding surface 128. In one or more embodiments, the platform 126 may not completely surround the ASIC cavity 120. For example, the platform 126 may extend only on one side of the ASIC cavity 120 that is adjacent to the MEMS transducer 104. In some other embodiments, the platform 126 may extend along a complete or partial length of one or more sides of the ASIC cavity 120.

Figure 3:
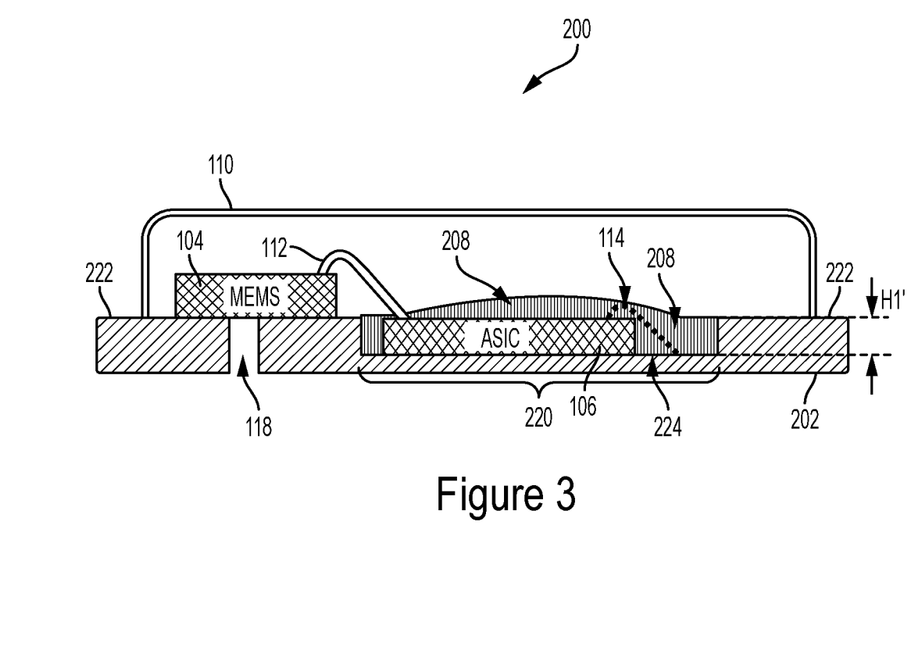
FIG. 3 shows a representation of a cross-sectional view of a second example microphone device according to embodiments of the present disclosure.

FIG. 3 shows a representation of a cross-sectional view of a second example microphone device 200 according to the embodiments of the present disclosure. Several elements of the second example microphone device 200 are similar to the components of the first example microphone device 100 shown in FIG. 1. To that extent, the similar elements have been labeled with similar reference numbers. The second example microphone device 200 does not include a platform. The substrate 202 has an ASIC cavity 220 formed within a front surface 222 of the substrate 202, and a bottom surface of the ASIC cavity 220 serves as an ASIC mounting surface 224. The height H1' of the ASIC cavity 220 is greater than the height of the ASIC 106, such that the entirety of the ASIC 106 falls within a volume of the ASIC cavity 220. In some embodiments, the height H1' can be equal to or greater than the height of ASIC 106. In still further embodiments, the height H1' can be less than the height of the ASIC 106. For example, the ASIC 106 may be taller than the height H1' of the cavity, but the difference in the heights may be sufficiently small such that an encapsulating material 208 does not contact the MEMS transducer 104 and/or a cover mounting surface during deposition. By having the height of the ASIC cavity 220 to be greater than a height of the ASIC 106, the risk of spillover of the encapsulating material 208 during deposition can be reduced while ensuring that the encapsulating material 208 fully covers the ASIC 106 and at least a portion of the second set of wires 114.

The substrate 202 can also include a cover mounting surface (not shown) to facilitate bonding the cover 110 onto the front surface 222 of the substrate 202. The cover mounting surface can be similar to the cover bonding surface 128 discussed above in relation to FIG. 2.

In one or more embodiments, more than one ASIC can be mounted within the cavity. For example, more than one ASIC can be disposed side-by-side within the cavity. In another example, more than one ASIC can be stacked on top of each other. In yet another example, more than one ASIC may be both stacked on top of each other and disposed side-by-side within the cavity. The encapsulation material can be deposited in the cavity such that it completely covers the more than one ASIC regardless of the manner in which the ASICs are arranged within the cavity.

As discussed above in relation to FIGS. 1-3, the encapsulating material 108 and 208 fully covers the ASIC 106 and fully or partially cover the second set of wires 114. By covering the ASIC 106 and the second set of wires 114 within the encapsulating material 108 or 208, an effect of radio frequency signals, generated by the ASIC 106 and the second set of wires 114, on the MEMS transducer 104 and other components mounted on the substrate 102 or 202 can be reduced. In some embodiments, completely covering the ASIC and partially or completely covering the wires in encapsulating material may cause a substantial reduction in noise in the microphone device as compared to a microphone device that does not include encapsulating material or only partially encapsulates an ASIC. By reducing the radio frequency interference, a level of noise in the electrical signals generated by the MEMS transducer 104 and the other components on the substrate 102 and 202 can be reduced. In some embodiments, an improvement in noise attenuation of about −15 dB is obtained for the microphone device having an encapsulating material completely covering the ASIC in comparison with a microphone device having no encapsulation material.

Figure 4:
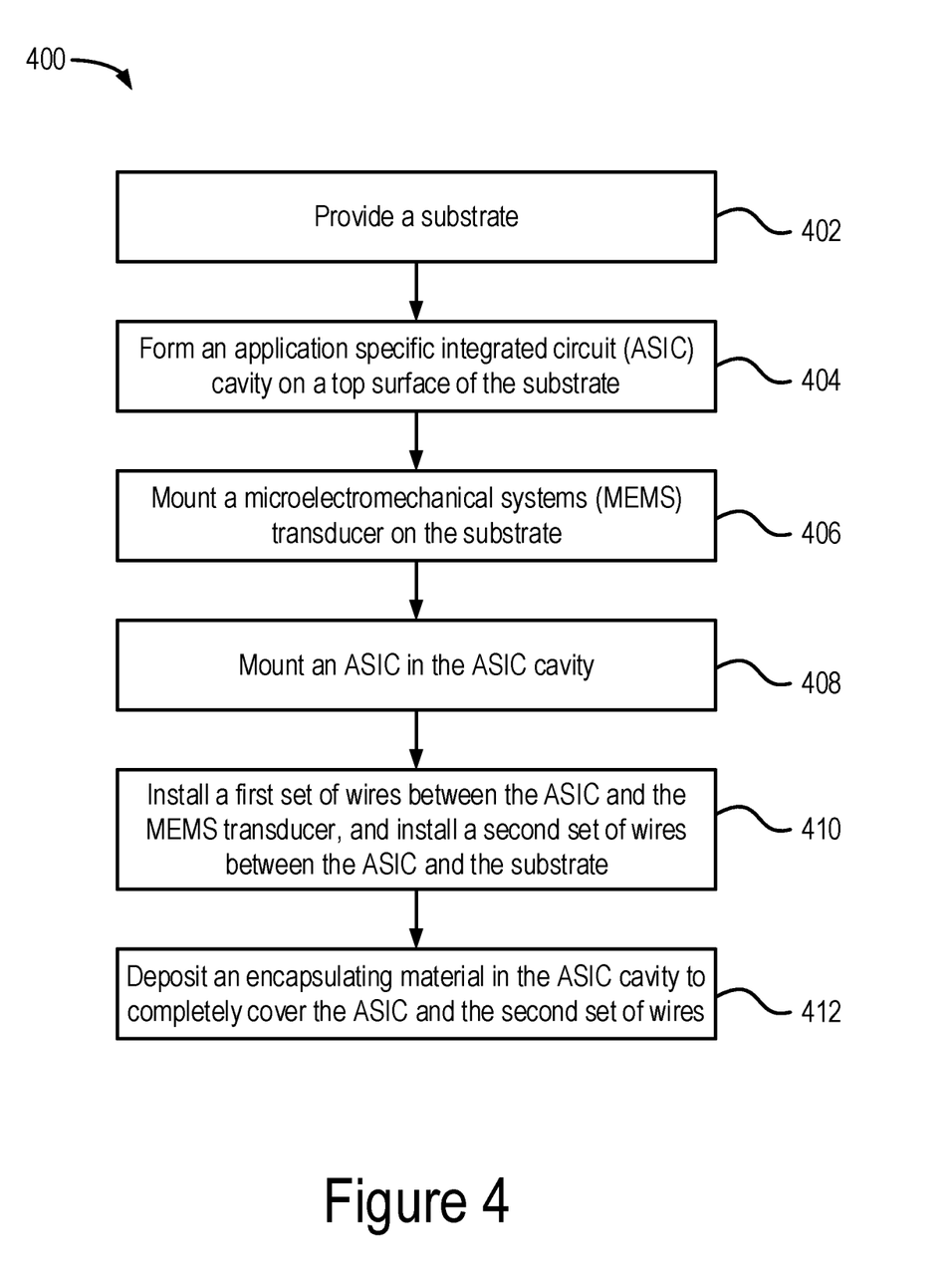
FIG. 4 shows a flow diagram of an example process for manufacturing a microphone device according to embodiments of the present disclosure.

FIG. 4 shows a flow diagram of an example process 400 for manufacturing a microphone device according to the embodiments of the present disclosure. The process 400 includes providing a substrate (stage 402), forming an ASIC cavity on a front surface of the substrate (stage 404), mounting a MEMS transducer on the substrate (stage 406), mounting an ASIC on an ASIC mounting surface in the ASIC cavity (stage 408), installing a first set of bonding wires between the ASIC and the MEMS transducer, and a second set of wires between the ASIC and the substrate (stage 410), and depositing an encapsulation material into the ASIC cavity to completely cover the ASIC and the second set of wires (stage 412). It should be noted that the order of stages described herein is provided by way of example only, and the present disclosure is not limited to any particular order of performing the stages. For example, in some embodiments, the MEMS transducer may be mounted prior to mounting of the ASIC, while in other embodiments, the ASIC may be mounted prior to mounting of the MEMS transducer.

The process 400 includes providing a substrate (stage 402). As discussed above in relation to FIGS. 1-3, the substrate can include a printed circuit board or a semiconductor material. In some embodiments, the substrate can be similar to the substrate 102 or the substrate 202 shown in FIGS. 1-3. The substrate can include a single-layered or a multi-layered printed circuit board, where each layer can include a set of conductive traces separated by insulators. The conductive traces can be patterned based on the locations connectivity of the components, such as the MEMS transducer and the ASIC to be mounted on the substrate.

The process 400 further includes creating an ASIC cavity on a front surface of the substrate (stage 404). One example implementation of this process stage is discussed above in relation to FIG. 1. The ASIC cavity 120 is created on a front surface 122 of the substrate 102. In another example, as shown in FIG. 3, the ASIC cavity 220 is formed on the front surface 222 of the substrate 202. In some embodiments, the cavity in the front surface of the substrate can be created using one or more of chemical etching, a photoengraving routing, stamping or blanking through a substrate layer, and the like. The bottom of the cavity can form an ASIC mounting surface for mounting an ASIC. The ASIC mounting surface can include one or more bonding pads that can be connected to bonding pads on the ASIC using wire bonding. In some embodiments, the process 400 also can include forming a ledge or a platform adjacent to the ASIC cavity. One example of such a platform is discussed above in relation to FIGS. 1 and 2. In one or more embodiments, the platform can be formed by etching the surface of the substrate around the desired location of the platform. In some other embodiments, the platform can be formed by depositing additional layers of the substrate at the desired location of the platform. In one or more embodiments, the substrate and the platform can be formed of the same material. In one or more embodiments, the substrate and the platform can be formed of different materials. For example, materials used for forming the substrate and the platform can include materials such as fiberglass, epoxy resin, and solder mask.

The process 400 further includes mounting a MEMS transducer on a front surface of the substrate (stage 406) and mounting an ASIC on an ASIC mounting surface (stage 408). Example implementations of these process stages are discussed above in relation to FIGS. 1-3. For example, as shown in FIGS. 1-3, the MEMS transducer 104 is mounted on the substrate 102 or 202, and the ASIC 106 is mounted on the ASIC mounting surface 124 or 224. The MEMS transducer 104 and the ASIC 106 can be mounted manually or by machine (e.g., using a "pick and place machine"). In some embodiments, flip-chip techniques also can be used to mount the MEMS transducer 104 and the ASIC 106.

The process 400 also includes installing a first set of bonding wires between the ASIC and the MEMS transducer, and a second set of wires between the ASIC and the substrate (stage 410). Examples of the implementation of this process stage are discussed above in relation to FIGS. 1-3. For example, a first set of wires 112 are installed to electrically connect the MEMS transducer 104 to the ASIC 106. A second set of wires 114 are installed to electrically connect the ASIC 106 to conductive traces on the substrate 102. The first set of wires 114 and the second set of wires can include conductive materials such as aluminum, copper, silver, gold, and the like. The wires can be installed using techniques such as ball bonding, wedge bonding, and compliant bonding.

The process 400 additionally includes depositing an encapsulation material into the ASIC cavity to completely cover the ASIC and the second set of wires (stage 412). Examples of the implementation of this process stage are discussed above in relation to FIGS. 1-3. For example, as shown in FIGS. 1 and 2, the encapsulating material 108 completely cover the ASIC 106 and the second set of wires 114. Similarly, as shown in FIG. 3, the encapsulating material 208 completely covers the ASIC 106 and the second set of wires 114. In some embodiments, the encapsulating material can be an epoxy, or materials such as resins, polymers, glass, plastic, and the like. Before deposition, the encapsulating material can be heated to a predetermined temperature to allow the encapsulating material to flow. The heated epoxy can be deposited in the ASIC cavity such that it completely covers the ASIC and the second set of wires that connect the ASIC to the substrate. During deposition, the sidewalls of the ASIC cavity confine the encapsulating material to within the cavity, and reduce the risk of the encapsulating material coming in contact with the MEMS transducer or other components on the substrate. The deposited encapsulating material can be given time to settle into a steady state with regard to flow within the ASIC cavity. If in the steady state, portions of the ASIC or the second set of wires remain exposed, additional encapsulating material can be added. The encapsulating material can then be cooled until it solidifies.

It should be noted that process stages in the process 400 depicted in FIG. 4 can be performed in an order different from the one shown in FIG. 4. For example, mounting the ASIC in the A SIC cavity (stage 408) can be carried out before mounting the MEMS transducer on the substrate (stage 406). Further, installation of the wires between the ASIC and the MEMS transducer and the ASIC and the substrate (stage 410) can be carried out in any order.

Figure 5:
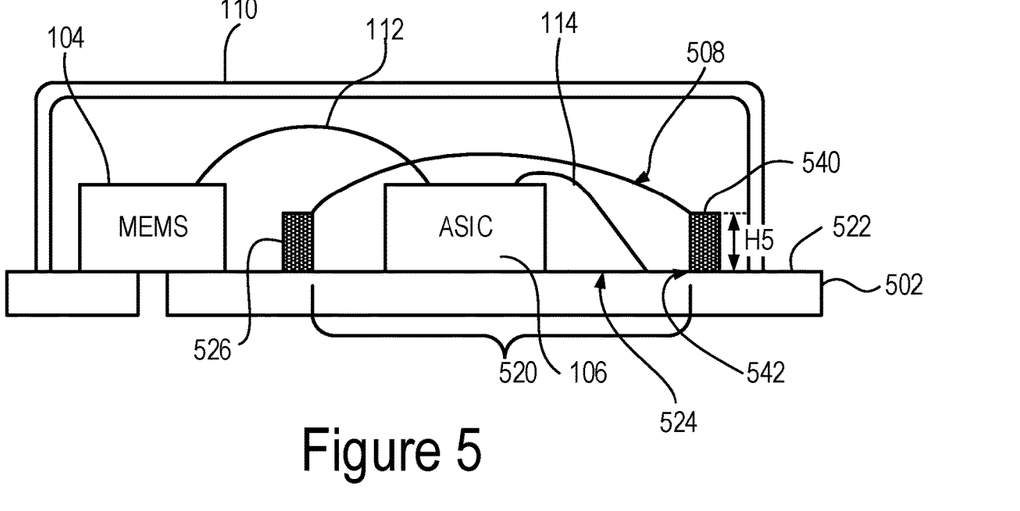
FIGS. 5 and 6 depict representations of a cross-sectional view and a top view, respectively, of a third example microphone device according to embodiments of the present disclosure.
Figure 6:
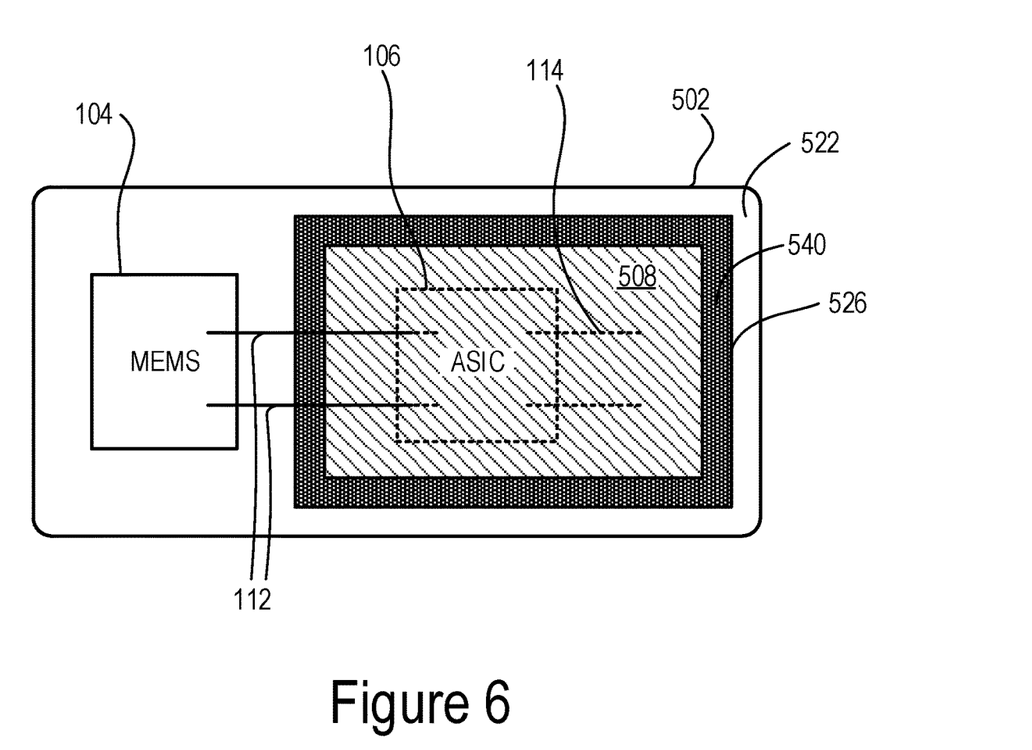

FIGS. 5 and 6 depict representations of a cross-sectional view and a top view, respectively, of a third example microphone device 500 according to embodiments of the present disclosure. In the third example, microphone 500 shown in FIGS. 5 and 6, an ASIC cavity 520 is formed by a wall 526 that rises above a front surface 522 of the substrate 502. The wall 526 has a top surface 540 that is positioned at a height H5 above the front surface 522 of the substrate 502. The height H5 can be greater than, equal to, or less than a height of the ASIC 106. A periphery 542 of the wall 526 defines an edge of the cavity 520. The ASIC 106 is mounted on a mounting surface 524 that is a portion of the front surface of the substrate 502.

The encapsulating material 508 is deposited within the ASIC cavity 520 and completely covers the ASIC 106 and at least partially covers the second set of wires 114. In one or more embodiments, the encapsulating material 508 entirely covers the second set of wires 114.

The wall 526 can completely surround the ASIC 106 and a portion of the front surface 522 of the substrate 502. In one or more embodiments, the wall 526 can be discontinuous. In one or more embodiments, the wall 526 may not entirely surround the ASIC 106. For example, the wall 526 may extend between the MEMS transducer 104 and the ASIC 106, so as to reduce the risk of the encapsulating material 508 making contact with the MEMS 104 during and after deposition. In one or more embodiments, the wall 526 can be incorporated in the first and the second example microphone devices 100 and 200 discussed above in relation to FIGS. 1-4. In some embodiments, the top surface 540 can be considered a top or front surface of the substrate, such that the cavity is formed in part or in whole as an area surrounded by the wall 526.

Figure 7:
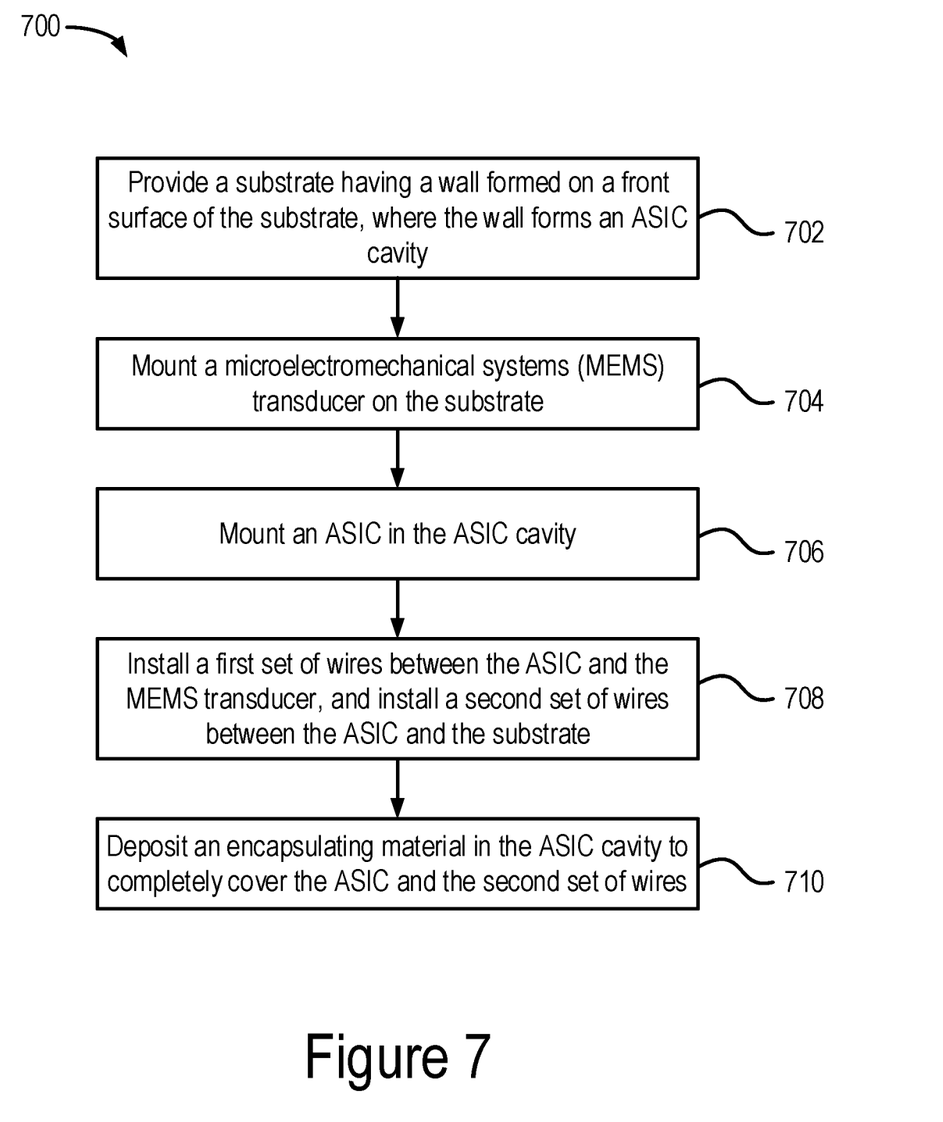
FIG. 7 shows a flow diagram of an example process for manufacturing a microphone device according to embodiments of the present disclosure.

FIG. 7 shows a flow diagram of an example process 700 for manufacturing a microphone device according to some embodiments of the present disclosure. In particular, the process 700 can be utilized for manufacturing the third example microphone device discussed above in relation to FIGS. 5 and 6, in some embodiments. The process 700 includes providing a substrate having a wall formed on a front surface of the substrate, where the wall forms an ASIC cavity (stage 702) mounting a MEMS transducer on the substrate (stage 704), mounting an ASIC on an ASIC mounting surface in the ASIC cavity (stage 706), installing a first set of bonding wires between the ASIC and the MEMS transducer, and a second set of wires between the ASIC and the substrate (stage 708), and depositing an encapsulation material into the ASIC cavity to completely cover the ASIC and the second set of wires (stage 710).

The process 700 includes providing a substrate having a wall formed on a front surface of the substrate, where the wall forms an ASIC cavity (stage 702). On example of this process stage is discussed above in relation to FIGS. 5 and 6, where the wall 526 forms a cavity 520 on the substrate 502. In one or more embodiments, the wall 526 can be formed of the same material as the substrate. For example, the wall can be formed by depositing additional layers of the substrate material. In one or more embodiments, the wall can be formed using a solder mask, a solder stop mask, or a solder resist. Multiple layers of the solder mask can be deposited around the ASIC in the desired pattern to form the wall. Stages 704-710 can be performed in a manner similar to that discussed above in relation to stages 406-412. It should be noted that the order of stages described herein is provided by way of example only, and the present disclosure is not limited to any particular order of performing the stages. For example, in some embodiments, the MEMS transducer may be mounted prior to mounting of the ASIC, while in other embodiments, the ASIC may be mounted prior to mounting of the MEMS transducer.

Figure 8:
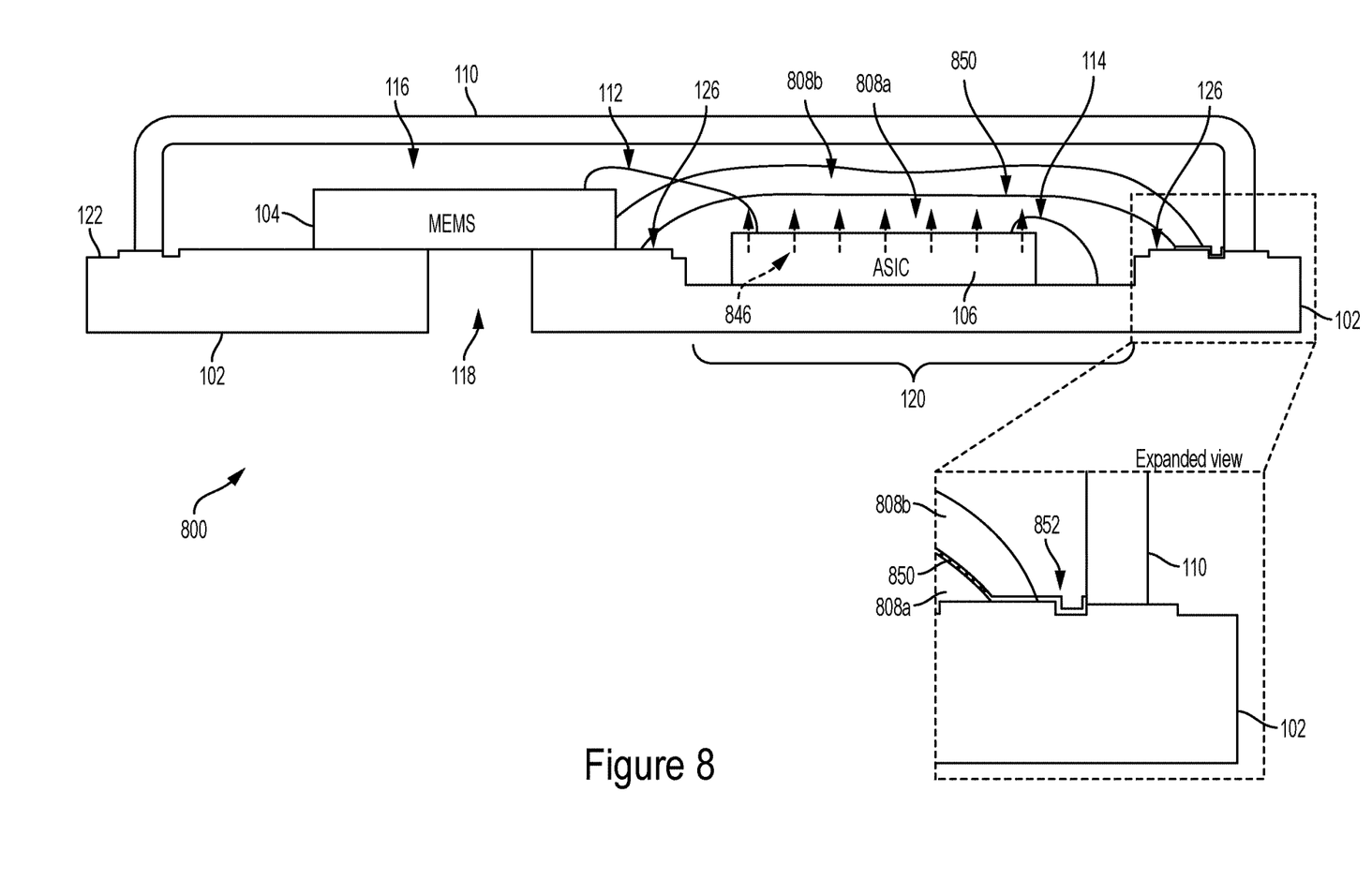
FIG. 8 shows a representation of a cross-sectional view of a fourth example microphone device according to embodiments of the present disclosure.

FIG. 8 is a representation of a cross-sectional view of a fourth example microphone device 800 according to embodiments of the present disclosure. The fourth example microphone device 800, in many aspects, is similar to the first example microphone device 100 discussed above in relation to FIGS. 1 and 2, and similar elements are referred to with similar reference numerals. The fourth example microphone device 800 includes a heat shield 850 embedded into the encapsulating material. In particular, a first portion of an encapsulating material 808a is deposited over the ASIC 106, over which a layer of heat shield 850 is deposited. A second portion of the encapsulating material 808b can be deposited over the heat shield 850, in some embodiments.

The heat shield 850 improves the performance of the fourth example microphone device 800. Specifically, the performance of the fourth example microphone device 800 may be affected by the heat radiated by the ASIC 106. The heat 846 radiated by the ASIC 106 may dissipate into the back volume 116 and raise the temperature of the air enclosed therein. This increase in the temperature may result in changes in pressure in the back volume 116, which in turn can affect the performance of the MEMS transducer 104. By including a heat shield 850 within the encapsulation material and over the ASIC 106, at least a portion of the heat 846 radiated by the ASIC 106 can be reflected back towards the ASIC 106 and away from the back volume. As a result, the impact of the heat 846 radiated by the ASIC 106 on the temperature or pressure of the air in the back volume 116 and on the performance of the MEMS transducer 104 is reduced.

The heat shield 850 can include metals, such as, for example, aluminum, copper, gold, silver, and the like. The heat shield 850 may also include other materials that can reflect radiated heat. In one or more embodiments, the heat shield 850 can be structured as a continuous film. In some other embodiments, the heat shield 850 can be structured as a discontinuous film, such as for example a grid-shaped or net-shaped structure. In one or more embodiments, the heat shield 850 can be electrically connected to a ground plane of the fourth microphone device 800. For example, as shown in the expanded view, an electrical connector 852 can be disposed over the platform 126, where the electrical connector 852 electrically connects the heat shield 850 to a ground plane (not shown) disposed on the platform 126. Electrically grounding the heat shield 850 can provide an additional benefit of shielding the MEMS transducer 104 from electromagnetic interference due to the electromagnetic energy generated by the ASIC 106. The electrical connector 852 may also make contact with the cover 110, which may also be electrically connected to the ground plane.

Figure 9:
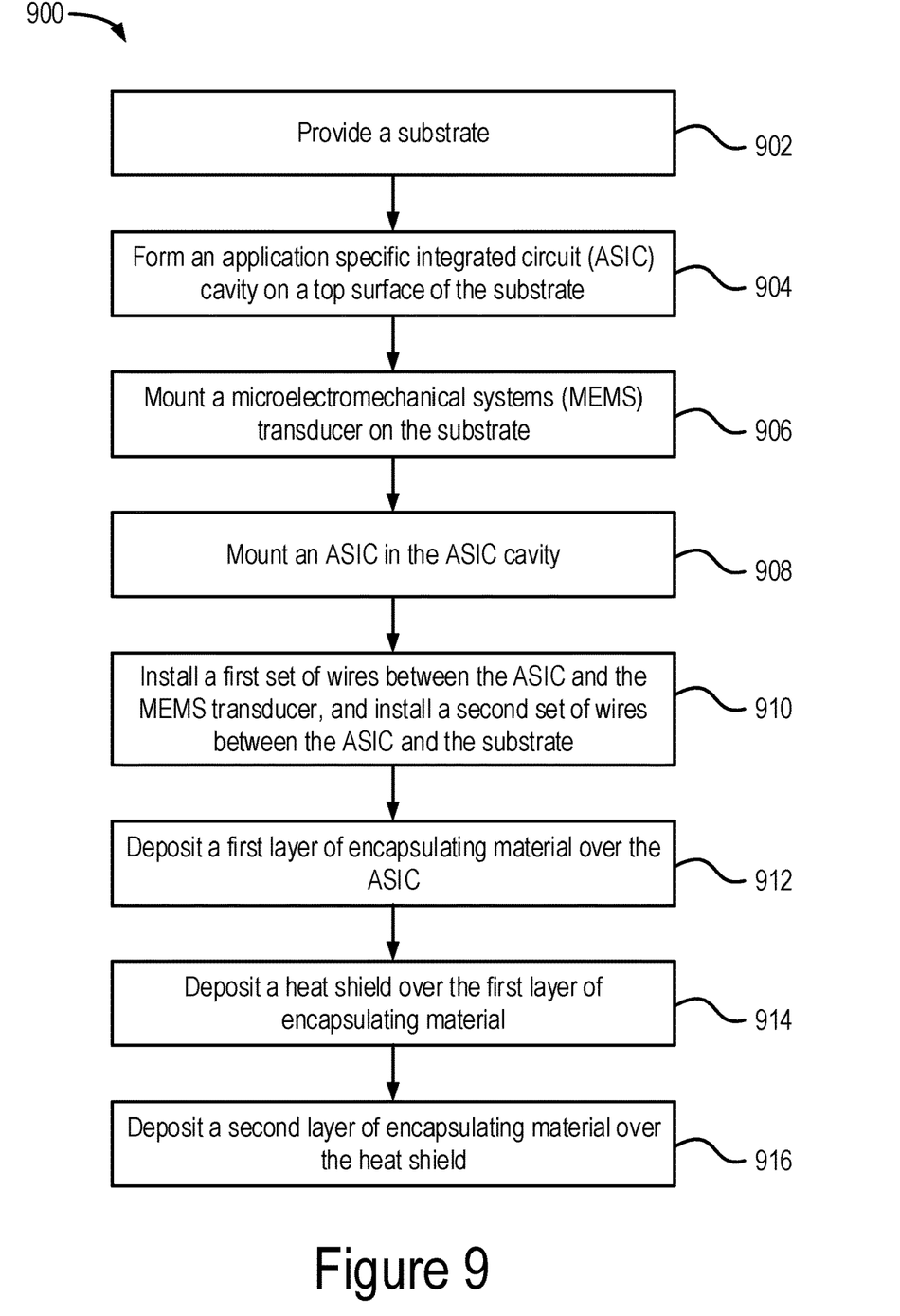
FIG. 9 shows a flow diagram of an example process for manufacturing a microphone device according to embodiments of the present disclosure.

FIG. 9 shows a flow diagram of an example process 900 for manufacturing a microphone device according to the embodiments of the present disclosure. The process 900 includes providing a substrate (stage 902), forming an ASIC cavity on a front surface of the substrate (stage 904), mounting a MEMS transducer on the substrate (stage 906), mounting an ASIC on an ASIC mounting surface in the ASIC cavity (stage 908), installing a first set of bonding wires between the ASIC and the MEMS transducer and a second set of wires between the ASIC and the substrate (stage 910), depositing a first layer of encapsulating material over the ASIC (stage 912), depositing a heat shield over the first layer of encapsulating material (stage 914), and, optionally, depositing a second layer of encapsulating material (stage 916).

The process 900 including the stages 902, 904, 906, 908, and 910 can be similar to those discussed above in relation to the process 400 (FIG. 4) stages 402, 404, 406, 408, and 410, respectively. The process 900 further includes depositing a first layer of encapsulating material over the ASIC (stage 912). As shown in FIG. 8, the first layer of encapsulating material 808a is deposited over the ASIC 106. In some embodiments, the first layer of encapsulating material 808a can completely cover the ASIC 106 and the second set of wires 114.

After the deposition of the first layer of encapsulating material 808a, a heat shield can be deposited over the first layer of encapsulating material (stage 914). As shown in FIG. 8, the heat shield 850 is deposited over the first layer of encapsulating material 808a. The heat shield can be deposited using any deposition technique that can deposit a conductive material. In one or more embodiments, a metal sputtering technique can be utilized to coat the exposed surfaces of the first layer of encapsulating material 808a with the conductive material. In one or more embodiments, the deposition technique can utilize a solution including nano-sized metal particles, or can utilize an organometallic solution. The solution including suspended nano-sized metal particles or the organometallic solution can be deposited over the first layer of encapsulating layer 808a by a jetting or micro/nano spray such that the deposited conductive material covers the exposed surface of the first layer of encapsulating material 808a.

A mask can also be utilized to limit the area over which the conductive material is deposited. For example, the mask can be structured to avoid the deposition of the conductive material over the MEMS 104. The mask can also be structured to allow deposition of the conductive material over the platform 126 to form the electrical connection with the ground plane. In instances where the electrical connector 852 is provided separately from the deposition of the conductive material to form the heat shield, the mask can be structured such that the conductive material is deposited on at least a portion of the electrical connector 852 to provide an electrical connection between the electrical connector 852 and the heat shield 850. In one or more embodiments, the conductive material can be deposited to form a continuous film. In other embodiments, a partially discontinuous film may also be formed. The mask can be structured to provide, for example, a grid-like or a net-like structure to the heat shield 850. In one or more embodiments, the mask can be structured such that the conductive material does not make contact with the first set of wires 112, to avoid a short circuit. For example, the mask can be structured to introduce an aperture or a cut out in the heat shield 850 through which the first set of wires 112 can pass without making an electrical contact.

In some instances, insulated bonding wires can be used to implement the first set of wires 112. The insulated bonding wires can provide electrical isolation for the current carried on the first set of wires from the conductive material of the heat shield. In some such instances, there may be no need to use a mask to form an aperture or a cut out in the heat shield 850, thereby reducing the manufacturing cost and time. In one or more embodiments, the insulated bonding wires used to implement the first set of wires 112 can have a diameter of about 15 microns to about 25 microns, or about 20 microns. In one or more embodiments, the insulated bonding wires can be used to implemented the second set of wires 114 as well.

In one or more embodiment, the deposited conductive material can be baked at a temperature of about 200 to about 300 degrees C. if the deposited conductive material is suspended in a solution. Of course, this temperature is merely an example, and can be a function, in part, of the conductive material used. In instances where an organometallic solution is deposited, the deposited solution can be baked at less than about 200 degrees C. Depending upon the particle size of the conductive material and the baking temperature, the resulting conductive film can be "tuned" to exhibit different surface properties (such as, emissivity and absorptivity) with respect to incident radiation (such as, e.g., infra-red). As an example, particle sizes of about 15 angstrom to about 25 angstrom or about 20 angstrom and a baking temperature greater than about 200 degrees C. can result in the formation of a conductive film with surface properties that are similar to bulk or near-bulk surface properties of gold, for example. In some embodiments, the particle sizes of the conductive material and/or the baking temperature can be adjusted to achieve the desired surface properties.

After the deposition and formation of the heat shield 850 over the first layer of encapsulation material 808*a*, a second layer of encapsulation material 808*b* can optionally be deposited over the heat shield 850. The second layer of encapsulated material 808*b* can completely cover the heat shield and partially cover the first set of wires 112. The material composition of the first layer of the encapsulation material and the second layer of encapsulating material 808*b* can be similar to that of the encapsulation material 108 discussed above in relation to FIGS. 1-3. In addition, the technique of depositing the first and second layer of encapsulating material 808*a* and 808*b* can be similar to that discussed in relation to the encapsulating material 108.

The heat shield 850 discussed above in relation to FIGS. 8 and 9 can also be included in other embodiments discussed above. For example, each of the second example microphone device 200 shown in FIG. 3, and the third example microphone device 500 shown in FIG. 5 can include a heat shield within the encapsulating materials 208 and 508, respectively. The methods of manufacture of each of these example microphone devices can be adapted to include the process of depositing two layers of encapsulating materials and a conductive layer therebetween to form a heat shield.

Various example embodiments discussed herein can provide substantial advantages over existing designs, such as substrate-embedded ASIC packages. In such packages, the ASIC is completely surrounded by the substrate material, and is embedded inside the substrate during the manufacturing process of the substrate. However, embedding the ASIC inside the substrate raises overall cost of the microphone device. For example, defects in substrate can cause a good ASIC embedded in the defected substrate to be discarded along with the defected substrate. Further, there is an increased burden in the design phase to finalize the designs of the ASIC and the substrate early in the manufacturing process because of the additional lead-time needed to embed the ASIC into the substrate. Further, the inventory of ASICs is held up inside the substrate. Various embodiments discussed herein, on the other hand, allow the microphone device to be manufactured with established substrate and semiconductor processes, as the ASIC is encapsulated after the manufacture of the substrate. Moreover, the ASIC inventory is not held up during the manufacture of the substrate. This reduces the complexity of the manufacturing process of an encapsulated ASIC and reduces the time to market.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone device comprising:
   a housing including a substrate having a first surface and a cover disposed over the substrate, the housing including a sound port between the interior of the housing and the exterior of the housing;
   a microelectromechanical systems (MEMS) transducer mounted on the substrate;
   an integrated circuit (IC) mounted on the substrate;
   the MEMS transducer electrically connected to the IC;
   the IC electrically connected to a conductor on the substrate;
   an encapsulating material covering the IC; and
   an encapsulating material confinement structure disposed between the MEMS transducer and the IC, wherein the encapsulating material confinement structure at least partially confines the encapsulating material around the IC.

2. The microphone device of claim 1, wherein the encapsulating material completely covers the IC.

3. The microphone device of claim 2 further comprising:
   a set of wires interconnecting the IC to the conductor of the substrate, the set of wires at least partially covered by the encapsulating material;
   a cavity disposed in the substrate and including a wall portion forming the encapsulating material confinement structure, the cavity including an IC mounting surface on which the IC is mounted, wherein the encapsulating material is at least partially confined by the cavity.

4. The microphone device of claim 2 further comprising:
   a set of wires interconnecting the IC to the conductor on the surface of the substrate, the set of wires at least partially covered by the encapsulating material;
   the encapsulating material confinement structure includes a wall portion disposed between the MEMS transducer and the IC;
   the MEMS transducer and the IC mounted on coplanar surface portions of the substrate, wherein the encapsulating material is at least partially confined by the wall portion.

5. The microphone device of claim 1, wherein the encapsulating material comprises epoxy.

6. The microphone device of claim 1, further comprising a set of wires at least partially covered by the encapsulating material, the set of wires interconnecting the IC to the conductor on the substrate.

7. The microphone device of claim 1, further comprising an electrically conductive heat shield least partially covering the IC.

8. The microphone device of claim 7, wherein the heat shield is disposed between a first layer of encapsulating material and a second layer of encapsulating.

9. The microphone device of claim 7, wherein the heat shield is electrically connected to a ground plane disposed on the substrate.

10. The microphone device of claim 7, wherein the heat shield includes at least one metallic material.

11. The microphone device of claim 1, wherein the IC is flip-chip mounted on the substrate.

12. The microphone device of claim 1, wherein the encapsulating material confinement structure includes a wall portion disposed between the MEMS transducer and the IC.

13. The microphone device of claim 12, wherein the MEMS transducer and the IC are mounted on coplanar surface portions of the substrate, wherein the wall portion protrudes above the coplanar surface portions of the substrate and the encapsulating material is at least partially confined by the wall portion.

14. The microphone device of claim 13, wherein the wall portion is a discrete member disposed on the substrate.

15. The microphone device of claim 14, wherein the wall portion is formed of a different material than the substrate.

16. The microphone device of claim 13, wherein the wall portion completely surrounds the IC.

17. The microphone device of claim 12, the substrate defining a cavity including an IC mounting surface on which the IC is mounted, the wall portion forming a portion of the cavity, the MEMS transducer mounted on a MEMS mounting surface of the substrate, the MEMS mounting surface elevated relative to the IC mounting surface, wherein the encapsulating material is at least partially confined by the cavity.

18. The microphone device of claim 17, wherein the MEMS transducer and the cover are mounted on substantially coplanar surfaces of the substrate.

19. The microphone device of claim 17, wherein the cover is mounted on a cover mounting surface of the substrate, and the MEMS mounting surface is raised above the cover mounting surface of the substrate, and the cover mounting surface of the substrate is raised above the IC mounting surface.

20. The microphone device of claim 19, wherein the MEMS mounting surface is a platform that completely surrounds the entire periphery of the cavity.

21. The microphone device of claim 1, wherein the IC includes two ICs covered by the encapsulating material.

22. A method for manufacturing a microphone device comprising:
providing a housing having a substrate including a first surface and having a cover disposed over the substrate;
providing a sound port between the interior of the housing and the exterior of the housing;
mounting a microelectromechanical systems (MEMS) transducer on the substrate outside of the first surface;
mounting an application specific integrated circuit (IC) on the substrate within the first surface;
electrically connecting the MEMS transducer to the IC;
electrically connecting the ASIC IC to a conductor on the substrate within the first surface;
installing an encapsulating material confinement structure between the MEMS transducer and the IC;
depositing an encapsulating material onto the first surface such that the encapsulating material covers the IC, wherein the encapsulating material confinement structure at least partially confines the encapsulating material around the IC.

23. The method of claim 22, wherein depositing the encapsulating material onto the first surface includes depositing the encapsulating material onto the first surface such that the encapsulating material completely covers the IC.

24. The method of claim 22, further comprising forming a platform on the substrate at a periphery of the encapsulating material confinement structure, the platform including a MEMS mounting surface, wherein mounting the MEMS transducer on the substrate includes mounting the MEMS transducer on the MEMS mounting surface of the platform.

25. The method of claim 24, wherein the platform is raised above the first surface of the substrate.

26. The method of claim 24, wherein forming the platform includes forming the platform to surround the entire periphery of the encapsulating material confinement structure.

27. The method of claim 24, wherein forming the platform includes forming the platform such that the platform separates the periphery of the encapsulating material confinement structure from a cover mounting surface structured to receive the cover.

28. The method of claim 22, further comprising providing a set of wires interconnecting the IC to the conductor on the substrate, wherein depositing the encapsulating material includes depositing the encapsulating material such that the set of wires are at least partially covered by the encapsulating material.

29. The method or claim 22, further comprising forming a wall portion on the substrate, the wall portion surrounding the IC, wherein a top surface of the wall portion is the first surface of the substrate and a cavity comprises an area surrounded by the wall portion.

30. The method of claim 22, wherein the encapsulating material is a first layer of encapsulating material, the method further comprising:
depositing a conductive material over the first layer of encapsulating material; and
depositing a second layer of encapsulating material over the conductive material.

31. The method of claim 30, wherein depositing the conductive material over the first layer of encapsulating material includes depositing at least one of conductive nano-sized metal particles suspended in a solution or an organometallic solution using a jetting or micro-spray over the first layer of encapsulating material.

* * * * *